(12) United States Patent
Park et al.

(10) Patent No.: US 11,469,286 B2
(45) Date of Patent: Oct. 11, 2022

(54) DISPLAY DEVICE WITH CAPACITOR ELECTRODE OVERLAPPING GATE ELECTRODE

(71) Applicant: Samsung Display Co., LTD., Yongin-si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 240 days.

(21) Appl. No.: 16/800,634

(22) Filed: Feb. 25, 2020

(65) Prior Publication Data
US 2020/0279900 A1    Sep. 3, 2020

(30) Foreign Application Priority Data
Feb. 28, 2019 (KR) .......................... 10-2019-0023730

(51) Int. Cl.
*H01L 27/32* (2006.01)
*H01L 49/02* (2006.01)
*H01L 27/15* (2006.01)
*H01L 27/12* (2006.01)

(52) U.S. Cl.
CPC ........ *H01L 27/3262* (2013.01); *H01L 27/156* (2013.01); *H01L 27/3248* (2013.01);
(Continued)

(58) Field of Classification Search
CPC .............. H01L 27/3262; H01L 27/156; H01L 27/3248; H01L 27/3258; H01L 27/3265;
(Continued)

(56) References Cited

U.S. PATENT DOCUMENTS

| 10,038,097 | B2 | 7/2018 | Fang et al. |
| 2003/0141811 | A1* | 7/2003 | Park .................... H01L 27/3265 313/506 |

(Continued)

FOREIGN PATENT DOCUMENTS

| JP | 2015-176800 | 10/2015 |
| JP | 2017-173505 | 9/2017 |

(Continued)

*Primary Examiner* — Lex H Malsawma
(74) *Attorney, Agent, or Firm* — Kile Park Reed & Houtteman PLLC

(57) ABSTRACT

A display device includes a substrate, a first transistor disposed on the substrate and including a first active pattern having a first channel region, a first source region, a first drain region, and a first gate electrode, a first insulating layer disposed on the first transistor, a first electrode disposed on the first insulating layer and electrically connected to the first drain region, a second insulating layer having a first opening disposed on the first electrode, a first contact member disposed on the second insulating layer and electrically connected to the first electrode through the first opening, a third insulating layer having a second opening disposed on the first contact member, and a pixel electrode disposed on the third insulating layer and electrically connected to the first contact member through the second opening, and an emission layer disposed on the pixel electrode.

24 Claims, 16 Drawing Sheets

(52) U.S. Cl.
CPC ...... *H01L 27/3258* (2013.01); *H01L 27/3265* (2013.01); *H01L 27/3276* (2013.01); *H01L 28/60* (2013.01); *H01L 27/124* (2013.01); *H01L 27/1248* (2013.01); *H01L 27/1255* (2013.01)

(58) Field of Classification Search
CPC ............... H01L 27/3276; H01L 27/124; H01L 27/1248; H01L 27/1255; H01L 28/60
See application file for complete search history.

(56) References Cited

U.S. PATENT DOCUMENTS

| | | | |
|---|---|---|---|
| 2004/0004221 A1* | 1/2004 | Murade | H01L 29/78609 257/72 |
| 2004/0257489 A1* | 12/2004 | Gotoh | H01L 29/78633 349/44 |
| 2005/0051776 A1* | 3/2005 | Miyagi | G09G 3/3233 257/72 |
| 2007/0117239 A1* | 5/2007 | Ishi | H01L 29/78621 438/30 |
| 2014/0097455 A1* | 4/2014 | Ono | H01L 27/124 257/91 |
| 2018/0197898 A1* | 7/2018 | Luo | H01L 29/42392 |
| 2020/0118508 A1* | 4/2020 | Park | H01L 27/1255 |
| 2020/0168691 A1* | 5/2020 | Choi | H01L 27/3276 |
| 2020/0185489 A1* | 6/2020 | Jo | H01L 27/3248 |
| 2020/0266260 A1* | 8/2020 | Park | H01L 27/3276 |

FOREIGN PATENT DOCUMENTS

| | | |
|---|---|---|
| KR | 10-2016-0057587 | 5/2016 |
| KR | 10-2017-0026013 | 3/2017 |

* cited by examiner

DISPLAY DEVICE WITH CAPACITOR ELECTRODE OVERLAPPING GATE ELECTRODE

CROSS-REFERENCE TO RELATED APPLICATION

This application claims priority to and the benefit of Korean Patent Application No. 10-2019-0023730 under 35 U.S.C. § 119, filed in the Korean Intellectual Property Office on Feb. 28, 2019, the entire contents of which are incorporated herein by reference.

BACKGROUND

(a) Technical Field

The present disclosure relates to a display device, and more specifically, to a light emitting diode (LED) display device that minimizes opportunity for disconnection of the diode, while maximizing a light emission region.

(b) Description of the Related Art

LED displays, in contrast to liquid crystal displays (LCDs), have grown in popularity given their ability to emit light independently of a separate light source, and as a result, their ability to be of minimal thickness and thus overall weight. Additional benefits include low power consumption, and advantageous processing speed.

Typically, such an LED display includes pixels, and each pixel includes transistors and light-emitting elements. The transistors are connected to respective signal lines, and transmits a driving current to a light-emitting element. Each transistor may include an active pattern that includes a channel region and a conductive region.

The light-emitting element may include an anode and a cathode, and the anode may be connected to the transistor of the pixel in order to receive the driving current.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments herein are directed to optimizing a pixel structure of an LED display device so as to prevent opportunity for disconnection of the diode, while maximizing a light emission region.

A display device according to an exemplary embodiment of the present invention includes: a substrate; a first transistor disposed on the substrate and including a first active pattern having a first channel region, a first source region, a first drain region, and a first gate electrode; a first insulating layer disposed on the first transistor; a first electrode disposed on the first insulating layer and electrically connected to the first drain region; a second insulating layer having a first opening disposed on the first electrode; a first contact member disposed on the second insulating layer and electrically connected to the first electrode through the first opening; a third insulating layer having a second opening disposed on the first contact member; a pixel electrode disposed on the third insulating layer and electrically connected to the first contact member through the second opening; and an emission layer disposed on the pixel electrode, wherein the first gate electrode overlaps the first electrode to form a capacitor, when shown in a plan view, a center of the second opening is spaced from a center of the first opening, and when shown in cross-section, a light emitting region of the pixel electrode is disposed away from the first contact member.

A display device according to an exemplary embodiment of the present invention includes: a first transistor including a first gate electrode; a driving gate electrode including the first gate electrode; a capacitor electrode overlapping the driving gate electrode to form a capacitor; a first insulating layer having a first opening overlapping a portion of the capacitor electrode; a contact member electrically connected to the capacitor electrode through the first opening; a second insulating layer having a second opening overlapping the contact member; a pixel electrode electrically connected to the contact member through the second opening; an emission layer disposed on the pixel electrode; and a common electrode disposed on the emission layer, wherein, when shown in a plan view, a center of the second opening and a center of the first opening are spaced from each other, and when shown in cross-section, a light emitting region of the pixel electrode is disposed away from the contact member.

A display device according to an exemplary embodiment of the present invention includes: a substrate; a first transistor disposed on the substrate and including a first active pattern having a first channel region, a first source region, a first drain region, and a first gate electrode; a first insulating layer disposed on the first transistor; a first electrode disposed on the first insulating layer and electrically connected to the first drain region; a second insulating layer having a first opening disposed on the first electrode; a contact member disposed on the second insulating layer and electrically connected to the first electrode through the first opening; a third insulating layer having a second opening disposed on the contact member; a pixel electrode disposed on the third insulating layer and electrically connected to the contact member through the second opening; and an emission layer disposed on the pixel electrode, wherein, when shown in a plan view, an area of the contact member is smaller than a combined area including the pixel electrode and the first electrode, a center of the second opening is not aligned with a center of the first opening, and when shown in cross-section, a light emitting region of the pixel electrode is disposed away from the contact member.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
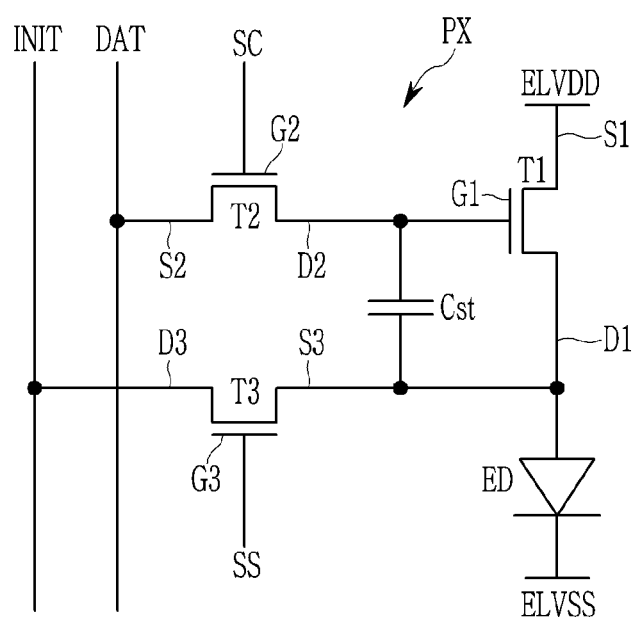
FIG. 1 is a circuit diagram for a pixel of a display device according to an exemplary embodiment of the invention.

Embodiments of the invention will be described more fully hereinafter with reference to the accompanying drawings. Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

The drawings and description are to be regarded as only illustrative in nature, and thus are not limiting of embodiments described and claimed herein. Some of the parts which are not associated with the description may not be provided in order to describe embodiments of the invention and like reference numerals refer to like elements throughout the specification.

In the drawings, a size and thickness of each element are arbitrarily represented for better understanding and ease of description, however the invention is not limited thereto. In the drawings, the thickness of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below a second object, and vice versa. When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a circuit diagram of a pixel PX of a display device according to an exemplary embodiment of the invention, though it is contemplated that the display device may include several additional pixels PX.

As shown, the pixel PX includes transistors T1, T2, and T3, a capacitor Cst, and at least one light emitting diode (LED) ED.

The transistors T1, T2, and T3 include a first transistor T1, a second transistor T2, and a third transistor T3. Source and drain electrodes, described below, separate two electrodes disposed on both sides of a channel of each transistor T1, T2, and T3.

A gate electrode G1 of the first transistor T1 is connected to one terminal of the capacitor Cst, a source electrode S1 of the first transistor T1 is connected to a driving voltage line transmitting a driving voltage ELVDD, and a drain electrode D1 of the first transistor T1 is connected to an anode of the light emitting diode (LED) ED and the other terminal of the capacitor Cst. The first transistor T1 receives a data voltage DAT according to a switching operation of the second transistor T2, and may supply a driving current to the light emitting diode (LED) ED depending on the voltage stored in the capacitor Cst.

A gate electrode G2 of the second transistor T2 is connected to a first scan line transmitting a first scan signal SC, a source electrode S2 of the second transistor T2 is connected to a data line transmitting the data voltage DAT or a reference voltage, and a drain electrode D2 of the second transistor T2 is connected to one terminal of the capacitor Cst and the gate electrode G1 of the first transistor T1. The second transistor T2 may be turned on, depending on the first scan signal SC, to transmit the reference voltage or the data voltage DAT to the gate electrode G1 of the first transistor T1 and one terminal of the capacitor Cst.

A gate electrode G3 of the third transistor T3 is connected to a second scan line transmitting a second scan signal SS, a source electrode S3 of the third transistor T3 is connected to the other terminal of the capacitor Cst, the drain electrode D1 of the first transistor T1, and the anode of the light emitting diode (LED) ED. A drain electrode D3 of the third transistor T3 is connected to an initialization voltage line for transmitting an initialization voltage INIT. The third transistor T3 may be turned on, depending on the second scan signal SS, to transmit the initialization voltage INIT to the anode of the light emitting diode (LED) ED and the other terminal of the capacitor Cst, thereby initializing the voltage of the anode of the light emitting diode (LED) ED.

One terminal of the capacitor Cst is connected to the gate electrode G1 of the first transistor T1, and the other terminal is connected to the source electrode S3 of the third transistor T3 and the anode of the light emitting diode (LED) ED. The cathode of the light emitting diode (LED) ED is connected to a common voltage line for transmitting a common voltage ELVSS.

The light emitting diode (LED) ED may emit light depending on the driving current formed by the first transistor T1.

An example of the operation of the circuit shown in FIG. 1, and particularly, an example of the operation during one frame, will now be described. In this example, the transistors T1, T2, and T3 are N-channel transistors, but are not limited thereto.

If one frame starts, in an initialization period, the first scan signal SC of a high level and the second scan signal SS of a high level are supplied to turn on the second transistor T2 and the third transistor T3. The reference voltage from the data line is supplied to the gate electrode G1 of the first transistor T1 and one terminal of the capacitor Cst through the turned-on second transistor T2, and the initialization voltage INIT is supplied to the drain electrode D1 of the first transistor T1 and the anode of the light emitting diode (LED) ED through the turned-on third transistor T3. Accordingly, during the initialization period, the drain electrode D1 of the first transistor T1 and the anode of the light emitting diode (LED) ED are initialized by the initialization voltage INIT. At this time, the capacitor Cst stores a voltage difference between the reference voltage and the initialization voltage INIT.

In a sensing period, if the second scan signal SS experiences a low level in a state in which the first scan signal SC of a high level is maintained, the second transistor T2 maintains the turn-on state, and the third transistor T3 is turned off. The gate electrode G1 of the first transistor T1 and one terminal of the capacitor Cst maintain the reference voltage through the turned-on second transistor T2, and the drain electrode D1 of the first transistor T1 and the anode of the light emitting diode (LED) ED are disconnected from the initialization voltage INIT through the turned-off third transistor T3. Accordingly, the first transistor T1 is turned off when the current flows from the source electrode S1 to the drain electrode D1, and then the voltage of the drain electrode D1 becomes "the reference voltage Vth" in which Vth represents a threshold voltage of the first transistor T1. At this time, the voltage difference between the gate electrode G1 and the drain electrode D1 of the first transistor T1 is stored in the capacitor Cst, such that the sensing of the threshold voltage Vth of the first transistor T1 is completed. By generating the data signal that is compensated by reflecting the sensed characteristic information during the sensing period, a characteristic deviation of the first transistor T1, which may be different for each pixel, may be externally compensated.

In a data input period, when the first scan signal SC of a high level is supplied and the second scan signal SS of a low level is supplied, the second transistor T2 is turned on and the third transistor T3 is turned off. The data voltage DAT from the data line is supplied to one terminal of the capacitor Cst and the gate electrode G1 of the first transistor T1 via the second turned-on transistor T2. In this case, the anode of the drain electrode D1 and the light emitting diode (LED) ED of the first transistor T1 may substantially maintain the potential in the sensing period according to the first transistor T1 in the turn-off state.

In a light emission period, the first transistor T1, which is turned on by the data voltage DAT transmitted to the gate electrode G1, generates the driving current according to the data voltage DAT, and the light emitting diode (LED) ED may be activated by the driving current.

The detailed structure of the display device according to an exemplary embodiment of the invention is now described with reference to FIGS. 1 and 2-7.

Figure 2:
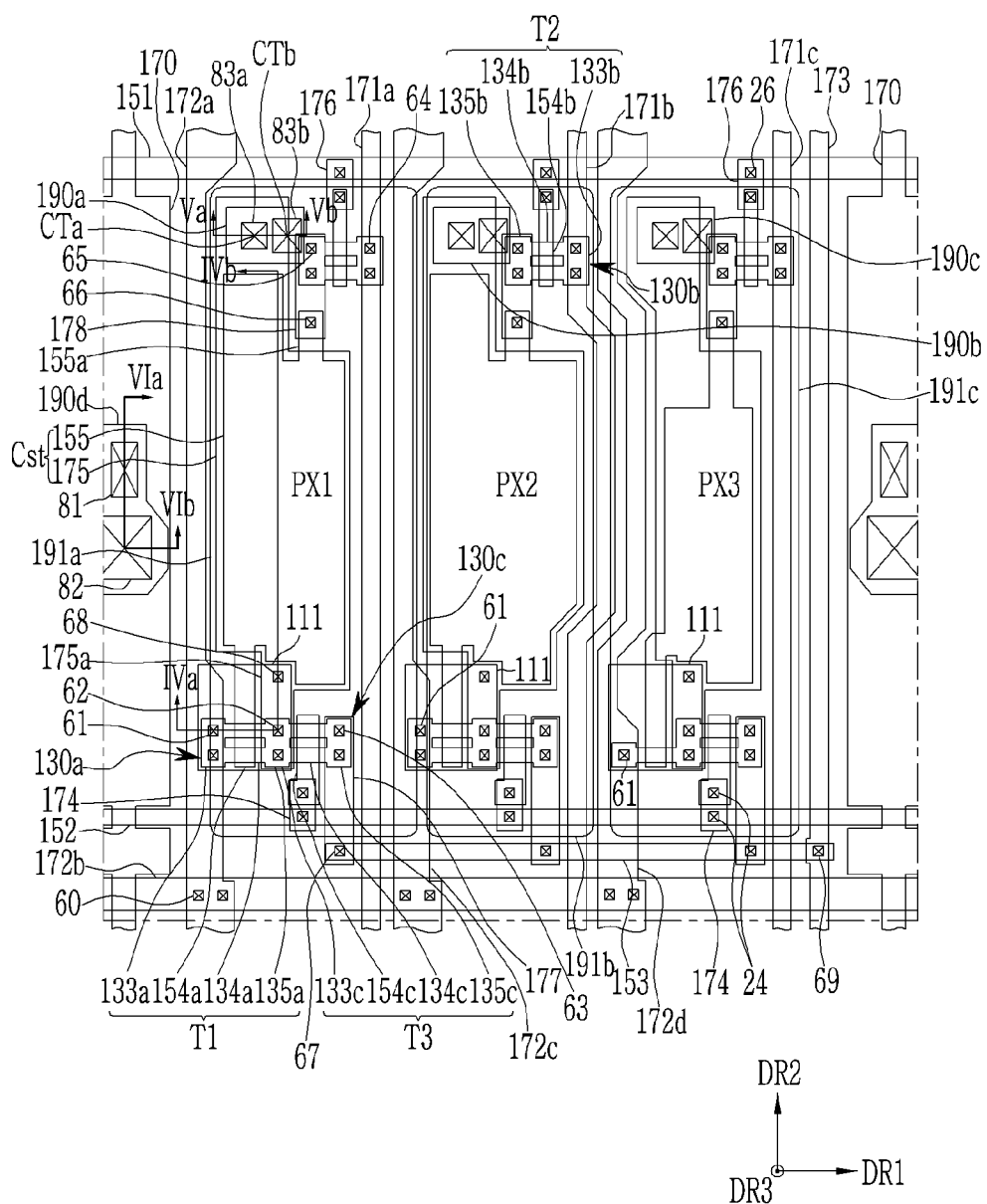
FIG. 2 is a plan layout view of pixels of a display device according to an exemplary embodiment of the invention.
Figure 3:
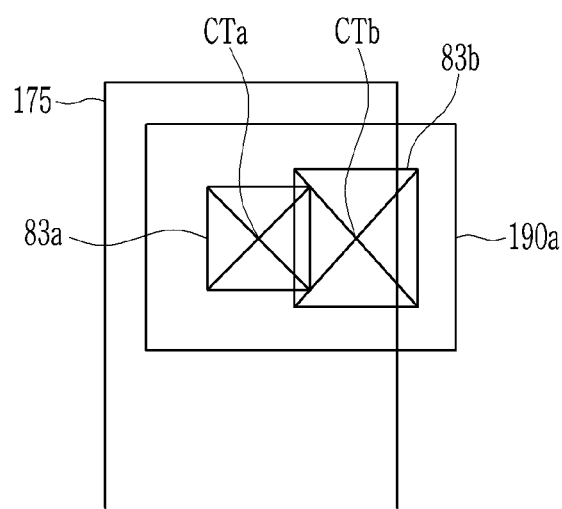
FIG. 3 is a plan layout view for a part of a pixel of a display device according to an exemplary embodiment of the invention.
Figure 4:
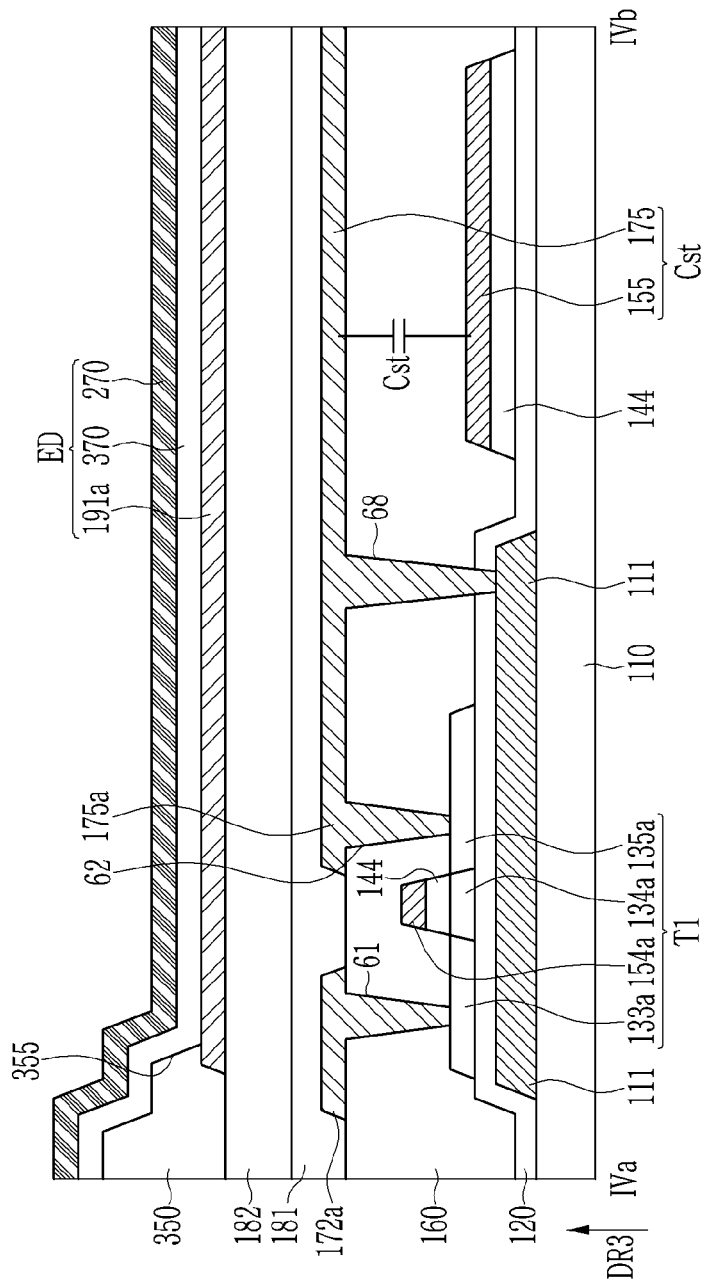
FIG. 4 is a cross-sectional view of the display device shown in FIG. 2 taken along line IVa-IVb of FIG. 2.
Figure 5:
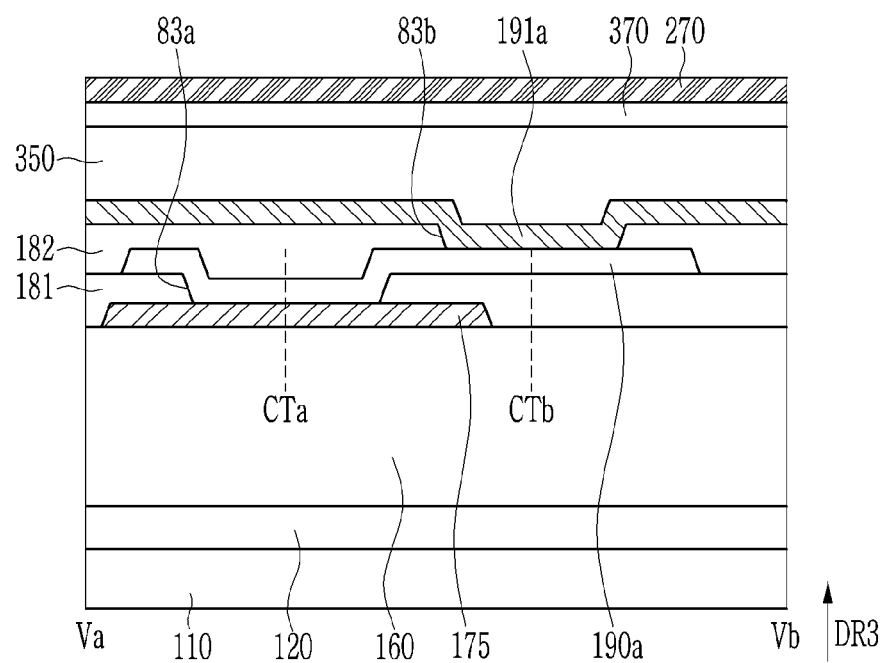
FIG. 5 is a cross-sectional view of the display device shown in FIG. 2 taken along line Va-Vb of FIG. 2.
Figure 6:
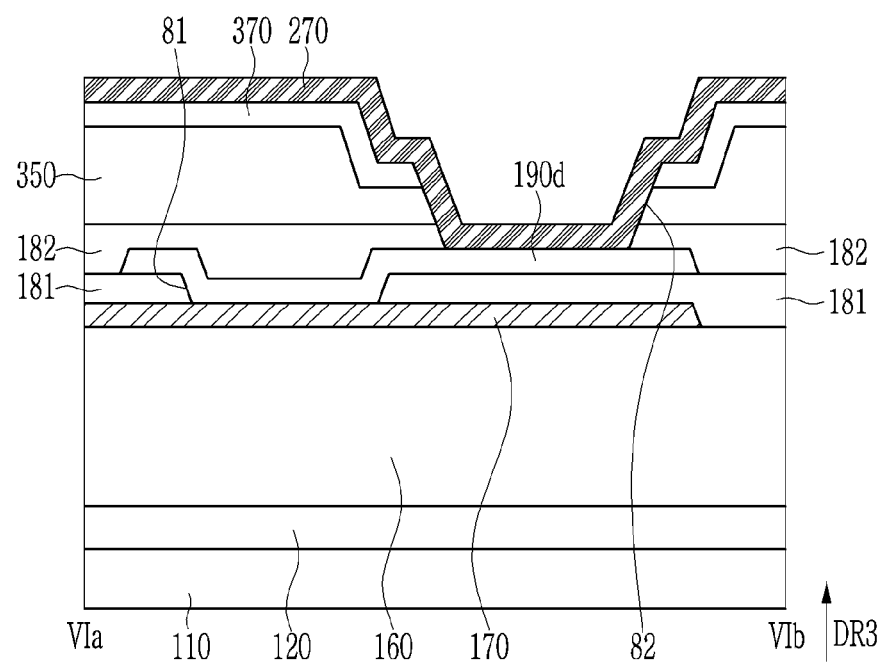
FIG. 6 is a cross-sectional view of the display device shown in FIG. 2 taken along a line VIa-VIb of FIG. 2.
Figure 7:
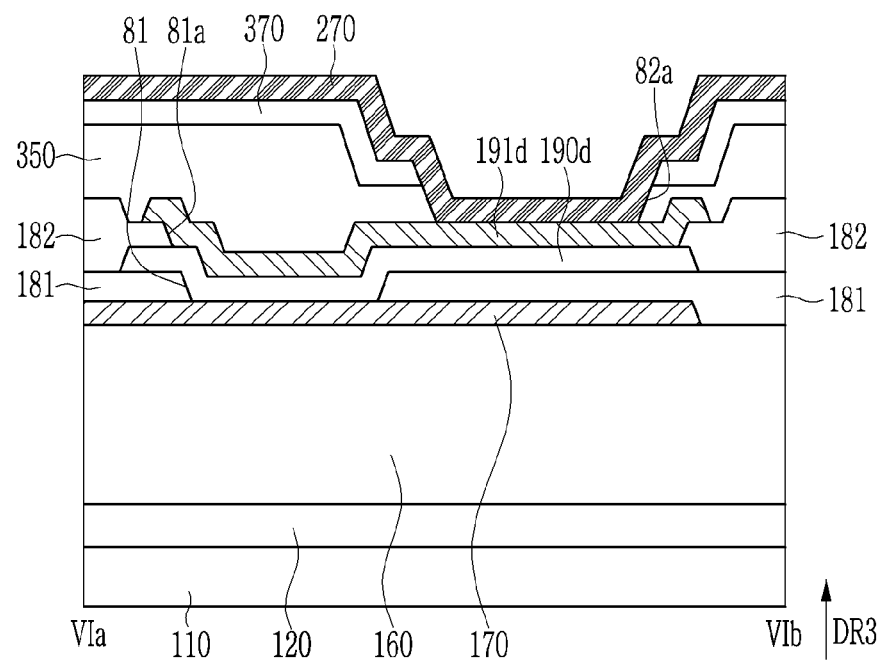
FIG. 7 is another cross-sectional view of the display device shown in FIG. 2 taken along line VIa-VIb of FIG. 2.

FIG. 2 is a plan layout view of pixels of a display device according to an exemplary embodiment of the invention, FIG. 3 is a plan layout view of a part of a pixel of a display device according to an exemplary embodiment of the invention, FIG. 4 is a cross-sectional view of the display device shown in FIG. 2 taken along line IVa-IVb thereof, FIG. 5 is a cross-sectional view of the display device shown in FIG. 2 taken along line Va-Vb thereof, FIG. 6 is a cross-sectional view of the display device shown in FIG. 2 taken along line VIa-VIb thereof, and FIG. 7 is another cross-sectional view of the display device shown in FIG. 2 taken along line VIa-VIb thereof.

The display device according to an exemplary embodiment may include a substrate 110 that may be flexible, and formed of an insulating material such as glass, plastic, or the like.

As shown, a first conductive layer including a lower pattern 111 may be disposed on the substrate 110. The lower pattern 111 may include various conductive metals, or a semiconductor material having a conductive characteristic.

A buffer layer 120 of an insulating layer may be disposed on the first conductive layer.

An active layer including active patterns 130a, 130b, and 130c may be disposed on the buffer layer 120. The active patterns 130a, 130b, and 130c are disposed in the respective pixels PX1, PX2, and PX3, and may include channel regions 134a, 134b, and 134c that are connected with a conductive region so as to form channels of the above-described transistors T1, T2, and T3. The conductive region of each of the active patterns 130a, 130b, and 130c may include source regions 133a, 133b, and 133c, and drain regions 135a, 135b, and 135c of the respective transistors T1, T2, and T3.

In each pixel PX1, PX2, and PX3, the active pattern 130a and the active pattern 130c may be connected to each other or may be spaced from each other. FIG. 2 shows an example in which the active pattern 130a and the active pattern 130c are connected to each other. In this case, the drain region 135a of the active pattern 130a may be the source region 133c of the active pattern 130c.

The active layer may include a semiconductor material such as amorphous silicon, polysilicon, or be an oxide semiconductor.

An insulating pattern 144 of a first insulating layer may be disposed on the active layer. The insulating pattern 144 may overlap the channel regions 134a, 134b, and 134c of the active patterns 130a, 130b, and 130c, and may be disposed on the channel regions 134a, 134b, and 134c, though the insulating pattern 144 may not substantially overlap the conductive regions of the active patterns 130a, 130b, and 130c.

A second conductive layer may be disposed on the insulating pattern 144. The second conductive layer may include a first scan line 151 capable of transmitting the first scan signal SC as described above, a second scan line 152 capable of transmitting the second scan signal SS, a transverse initialization voltage line 153 capable of transmitting the initialization voltage INIT, a transverse driving voltage line 172b capable of transmitting the driving voltage ELVDD, a driving gate electrode 155, a second gate electrode 154b, and a third gate electrode 154c. The gate electrode G1, the gate electrode G2, and the gate electrode G3 in the above-described circuit diagram may respectively correspond to the first gate electrode 154a, second gate electrode 154b, and third gate electrode 154c, each of which may be included in the driving gate electrode 155.

The first and second scan lines 151 and 152, the transverse initialization voltage line 153, and the transverse driving voltage line 172b may extend in the first direction DR1, respectively.

In a plan view, as is shown in FIG. 2, the driving gate electrode 155 may be disposed between the first scan line 151 and the second scan line 152.

Still referring to FIG. 2, the second gate electrode 154b is shown spaced apart from the first scan line 151, and may approximately extend in a second direction DR2. Alternatively, the second gate electrode 154b may be directly connected to the first scan line 151.

The third gate electrode 154c is spaced apart from the second scan line 152 and may approximately extend in the second direction DR2. Alternatively, the third gate electrode 154c may be directly connected to the second scan line 152.

The driving gate electrode 155 disposed at each pixel PX1, PX2, and PX3 may include a protruded portion 155a protruding upward, and a first gate electrode 154a protruding downward and extending generally in the second direction DR2.

The first gate electrode 154a intersects the active pattern 130a and overlaps the channel region 134a of the active pattern 130a. The second gate electrode 154b intersects the active pattern 130b and overlaps the channel region 134b of the active pattern 130b. The third gate electrode 154c intersects the active pattern 130c and overlaps the channel region 134c of the active pattern 130c.

With reference to FIG. 4, for example, a second insulating layer 160 may be disposed on the second conductive layer. Additionally, the buffer layer 120 and/or the second insulating layer 160 may include openings 24, 26, 60, 61, 62, 63, 64, 65, 66, 67, 68, and 69.

Still further, a third conductive layer may be disposed on the second insulating layer 160. The third conductive layer may include data lines 171a, 171b, and 171c, driving voltage lines 172a, 172c, and 172d, a common voltage line 170, an initialization voltage line 173, a capacitor electrode 175, and connecting members 174, 176, 177, and 178.

In the plan view shown in FIG. 2, the data lines 171a, 171b, and 171c, the driving voltage lines 172a, 172c, and 172d, the common voltage line 170, and the initialization voltage line 173 may respectively extend in the approximate second direction DR2, and intersect the first scan line 151 and the second scan line 152.

The pixels PX1, PX2, and PX3, for example and as shown in FIG. 2, may be arranged in the first direction DR1 and adjacent to each other, and may be repeatedly disposed in the first direction DR1 and the second direction DR2. The common voltage line 170 may be respectively disposed on the left side and right side of the pixels PX1, PX2, and PX3. When the pixels PX1, PX2, and PX3, of one or more repeated group of pixels, include three pixels PX1, PX2, and PX3, three data lines 171a, 171b, and 171c, three driving voltage lines 172a, 172c, and 172d, and at least one initialization voltage line 173 may be disposed between the two adjacent common voltage lines 170, as shown.

Each of the data lines 171a, 171b, and 171c is electrically connected to the source region 133b of the active pattern 130b through the opening 64 of the second insulating layer 160, wherein, as shown in FIG. 2, two openings 64 are shown in each of the pixels PX1, PX2, and PX3 to provide for such connection.

The driving voltage lines 172a, 172c, and 172d may be disposed so as to correspond to the pixels PX1, PX2, and PX3, respectively. The driving voltage lines 172a, 172c, and 172d are electrically connected to the source region 133a of the active pattern 130a through the opening 61 of the second insulating layer 160, wherein, as shown in FIG. 2, two openings 61 are shown in the pixels PX1 and PX2, and one opening 61 is shown in the pixel PX3. The driving voltage lines 172a, 172c, and 172d are electrically connected to the transverse driving voltage line 172b through the opening 60 of the second insulating layer 160. Thus, the transverse driving voltage line 172b may transmit the driving voltage together with the driving voltage lines 172a, 172c, and 172d, such that the driving voltage across the entire display device is transmitted in a mesh shape, i.e., in both directions DR1 and DR2.

The initialization voltage line 173 is electrically connected to the transverse initialization voltage line 153 through the opening 69 of the second insulating layer 160. Thus, the transverse initialization voltage line 153 may transmit the initialization voltage together with the initialization voltage line 173. For instance, even if one initialization voltage line 173 is formed for all three pixels PX1, PX2, and PX3, the initialization voltage may be transmitted to all three pixels PX1, PX2, and PX3 through the transverse initialization voltage line 153.

One capacitor electrode 175 may be disposed at each pixel PX1, PX2, and PX3. The capacitor electrode 175 may overlap the corresponding driving gate electrode 155 to thereby form the capacitor Cst. The driving gate electrode 155 may be referred to as a first capacitor electrode and the capacitor electrode 175 may be referred to as to a second capacitor electrode.

The capacitor electrode 175 may include a protrusion 175a that is downwardly extended toward the transistor T1, as is shown in FIG. 2. The protrusion 175a is electrically connected to the drain region 135a of the active pattern 130a (or the source region 133c of the active pattern 130c) through the opening 62 of the second insulating layer 160, wherein two openings 62 are shown at each pixel PX1, PX2, and PX3 in FIG. 2. Also, the capacitor electrode 175 is electrically connected to the lower pattern 111 through the opening 68 that extends through the second insulating layer 160 and the buffer layer 120.

Referring back to FIG. 2, the connecting member 174 may be electrically connected to the second scan line 152 and the third gate electrode 154c through the opening 24 of the second insulating layer 160 to electrically connect the second scan line 152 and the third gate electrode 154c.

Also, the connecting member 176 may be electrically connected to the first scan line 151 and the second gate electrode 154b through the opening 26 of the second insulating layer 160 to electrically connect the first scan line 151 and the second gate electrode 154b.

In each of the pixels PX1, PX2, and PX3, the connecting member 177 is electrically connected to the drain region 135c of the active pattern 130c through the opening 63 of the second insulating layer 160, wherein two openings 63 are shown at each pixel PX1, PX2, and PX3 in FIG. 2, and is also electrically connected to the transverse initialization voltage line 153 through the opening 67 of the second insulating layer 160, such that the drain region 135c of the active pattern 130c may be electrically connected to the transverse initialization voltage line 153.

The transverse initialization voltage line 153 extends in the first direction DR1 across three pixels PX1, PX2, and PX3. Alternatively, the transverse initialization voltage line 153 may be disposed between two adjacent common voltage lines 170 so as to not intersect the two common voltage lines 170. As is shown in FIG. 2, the transverse initialization voltage line 153 intersects three adjacent data lines 171a, 171b, and 171c, and may extend to the initialization voltage line 173.

The connecting member 178 is electrically connected to the drain region 135b of the active pattern 130b in each of the pixels PX1, PX2, and PX3 through the opening 65, wherein, as shown in FIG. 2, two openings 65 are provided in each of the pixels PX1, PX2, and PX3, and is electrically connected to the protrusion 155a of the driving gate electrode 155 through the opening 66 of the second insulating layer 160, such that the drain region 135b of the active pattern 130b and the protrusion 155a of the driving gate electrode 155 may be electrically connected.

It is to be understood that at least one of the first conductive layer, the second conductive layer, and the third conductive layer may be made of at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (T1), chromium (Cr), tantalum (Ta), and alloys thereof. Each of the first conductive layer, the second conductive layer, and the third conductive layer may include a single layer or multiple layers. For example, the third conductive layer may have a multilayer structure including an underlying layer including titanium and an overlying layer including copper.

In referring to FIGS. 2 and 4, for example, the first transistor T1 includes the channel region 134a, the source region 133a, the drain region 135a, and the first gate electrode 154a. The source region 133a of the first transistor T1 is electrically connected to the driving voltage lines 172a, 172c, and 172d to thereby receive the driving voltage discussed above.

The lower pattern 111, corresponds to the first transistor T1 and overlaps the channel region 134a between the channel region 134a of the first transistor T1 and the substrate 110 to prevent external light from reaching the channel region 134a, thereby reducing a leakage current and a deterioration of the first transistor T1. The lower pattern 111 is electrically connected to the drain region 135a of the first transistor T1 via the capacitor electrode 175.

The second transistor T2 includes the channel region 134b, the source region 133b, the drain region 135b, and the second gate electrode 154b. The source region 133b of the second transistor T2 is electrically connected to the data lines 171a, 171b, and 171c, thereby receiving the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive the initialization voltage from the transverse initialization voltage line 153.

A third insulating layer 181 may be disposed on the second insulating layer 160 and the third conductive layer. Referring to FIGS. 2 and 5-6, the third insulating layer 181 may include an opening 83a disposed on the capacitor electrode 175 and an opening 81 disposed on the common voltage line 170. The opening 83a may be disposed at a position overlapping a upper end of the capacitor electrode 175, as shown in the plan view of FIG. 2, for example.

A fourth conductive layer including contact members 190a, 190b, 190c, and 190d may be disposed on the third insulating layer 181.

Each of the contact members 190a, 190b, and 190c is disposed in each of the pixels PX1, PX2, and PX3, and may be in contact with the capacitor electrode 175 through the opening 83a to be electrically connected. The contact members 190a, 190b, and 190c may also overlap the upper end of the capacitor electrode 175 and the opening 83a.

Additionally, each contact member 190a, 190b, and 190c may include a part that does not overlap the capacitor electrode 175, and particularly the upper end of the capacitor electrode 175, as shown in FIG. 2. Further, each contact member 190a, 190b, and 190c may not overlap the driving gate electrode 155.

The contact member 190d may be electrically connected with the common voltage line 170 via the opening 81.

The contact members 190a, 190b, 190c, and 190d may improve the adherence of the capacitor electrode 175 and the common voltage line 170 of the third conductive layer and other conductive layers through contact therewith, and may prevent oxidation of at least the third conductive layer. This is particularly the case if the upper layer of the third conductive layer contains copper. For this purpose, the fourth conductive layer may include a conductive material that may prevent the corrosion of the upper layer of the third conductive layer by overlapping such upper layer. For example, the fourth conductive layer may include a conductive material such as a metal oxide such as ITO or IZO.

A fourth insulating layer 182 may be disposed on the third insulating layer 181 and the fourth conductive layer. Referring again to FIG. 2 and FIG. 5, the fourth insulating layer 182 may include an opening 83b disposed on each of the contact members 190a, 190b, and 190c.

Referring to FIG. 2, FIG. 3, and FIG. 5, and when viewed in both a plan view and in a cross-sectional view, the center CTa of the opening 83a of the third insulating layer 181 does not coincide with the center CTb of the opening 83b of the fourth insulating layer 182. That is, in the plan view, the center CTa of the opening 83a and the center CTb of the opening 83b are spaced apart from each other, such that the opening 83a and the opening 83b, in the plan view, may not overlap each other as shown in FIG. 2, or may partially overlap each other as shown FIG. 3.

As is also shown in the above-referenced figures, the opening 83a and the opening 83b both overlap with corresponding contact members 190a, 190b, and 190c of each of the pixels PX1, PX2, and PX3. Yet, the opening 83b may overlap the capacitor electrode 175 in a plan view or may not overlap. For example, as shown in FIG. 2, the opening 83b may include a portion that does not overlap with the capacitor electrode 175. That is, the opening 83b need not overlap with the capacitor electrode 175, such that the opening 83b may be disposed throughout the fourth insulating layer 182 without being aligned with the capacitor 175. That is, since electrical connection between the capacitor 175 and the contact members 190a, 190b and/or 190c is maintained via disposition of at least one of those members in opening 83a and opening 83b, it is unnecessary that each of the openings be aligned. Depending on the position of the opening 83b, the shapes of the contact members 190a, 190b, and 190c may be changed. Accordingly, a design of an overall pixel structure may be advantageously adapted based on a corresponding number of conductive layers, insulating layers, and provided openings without being restricted to aligning such openings to deliver an electrical connection within a pixel.

For example, as is shown in the plan view of FIG. 2, in each of the pixels PX1, PX2, and PX3, the opening 83a and the opening 83b and the first transistor T1 may be disposed opposite to each other with respect to a substantially transverse center line of the capacitor electrode 175.

At least one among the buffer layer 120, the first insulating layer 160, the second insulating layer 181, and the fourth insulating layer 182 includes an inorganic insulating material such as a silicon nitride (SiNx), a silicon oxide (SiOx), and a silicon oxynitride (SiON), and/or an organic insulating material. Particularly, the fourth insulating layer 182 may include the inorganic insulating material and/or the organic insulating material such as a polyimide, an acryl-based polymer, a siloxane-based polymer, or the like, and may have a substantially flat upper surface.

On the fourth insulating layer 182, a pixel electrode layer including pixel electrodes 191a, 191b, and 191c as a fifth conductive layer may be disposed. Each of the pixel electrodes 191a, 191b, and 191c may be disposed corresponding to each of the pixels PX1, PX2, and PX3 as shown in FIG. 2. The sizes and shapes of the pixel electrodes 191a, 191b, and 191c disposed on the three pixels PX1, PX2, and PX3 may differ in a planar view, and are not limited to the shown sizes and shapes. The pixel PX2 represents green, the pixel PX1 represents red, and the pixel PX3 represents blue, but are not limited thereto.

Each of the pixel electrodes 191a, 191b, and 191c may be in contact with the corresponding contact members 190a, 190b, and 190c through the opening 83b of the fourth insulating layer 182, and may be electrically connected to the capacitor electrode 175 through the contact members 190a, 190b, and 190c. Thus, each of the pixel electrodes 191a, 191b, and 191c may be electrically connected to the drain region 135a of the first transistor T1 to receive voltage from the first transistor T1.

The pixel electrode layer may include a transflective conductive material or a reflective conductive material.

Referring to FIGS. 4-7, a fifth insulating layer 350 may be disposed on the fourth insulating layer 182. The fifth insulating layer 350 has an opening 355 disposed on the pixel electrodes 191a, 191b, and 191c. The fifth insulating layer 350 may include an organic insulating material such as a polyacryl-based resin or a polyimide resin.

An emission layer 370 is disposed on the fifth insulating layer 350 and the pixel electrode layer 191a. The emission layer 370 may include a part disposed in the opening 355 of the fifth insulating layer 350 and may include an organic light emission material or an inorganic light emission material. Alternatively, at least part of the fifth insulating layer 350 may not be covered by the emission layer 370.

Referring to FIG. 6, the fifth insulating layer 350 and the emission layer 370 may include an opening 82 disposed on the contact member 190d.

A common electrode 270 is disposed above the emission layer 370. The common electrode 270 may be formed continuously over pixels PX1, PX2, and PX3. Still referring to FIG. 6, and also FIG. 2, the common electrode 270 may be electrically connected to the common voltage line 170 by contacting the contact members 190d through the opening 82 to receive the common voltage. The common electrode 270 may include a conductive transparent material.

When also referring to FIG. 7, the fourth insulating layer 182 further may also include an opening 81a disposed on the contact member 190d, and the pixel electrode layer may also include the contact member 191d in contact with the contact member 190d through the opening 81a. In this case, the fifth insulating layer 350 and the emission layer 370 may include an opening 82a disposed on the contact member 191d. Thus, the common electrode 270 is placed in contact with the contact member 191d through the opening 82a to be electrically connected to the contact member 190d and the common voltage line 170 to receive the common voltage ELVSS through common voltage line 170.

As will be understood, the pixel electrodes 191a, 191b, and 191c, the emission layer 370, and the common electrode 270 of each of the pixels PX1, PX2, and PX3 together form the light emitting diode (LED) ED, and one of the pixel electrodes 191a, 191b, and 191c and the common electrode 270 becomes a cathode and the other becomes an anode. In the above, the pixel electrodes 191a, 191b, and 191c become the anode.

In the plan view of FIG. 2, the region where the opening 355 of the fifth insulating layer 350 is disposed may define a light emission region of each of the pixels PX1, PX2, and PX3.

The edge of the opening 355 of the fifth insulating layer 350 defining the light emission region of each of the pixels PX1, PX2, and PX3 may be spaced from the opening 83b, and does not overlap the opening 83b. As such, the contact member 190a, 190b, or 190c disposed in the opening 83b does not overlap the opening 355. Accordingly, the emission layer 370 may be prevented from being disconnected due to a step near the light emission region edge, thereby preventing a reduction of a light emitting period of the light emitting diode (LED) ED. That is, the emission layer 370 may continue to operate to emit light since it is not overlapped at the edge of the opening 355, such that the edge of the opening 355 is disposed away from a contact member 190a, 190b, or 190c. Accordingly, a design of an overall pixel structure may be advantageously adapted based on a corresponding number of conductive layers, insulating layers, and provided openings without being restricted to aligning such openings to deliver an electrical connection within a pixel and light emission according to the pixel.

For instance, and when accomplishing the above continued operation of the emission layer 370, each of the contact members 190a, 190b, and 190c may not overlap the opening 355 of the fifth insulating layer 350. That is, referring to FIG. 5, in each of the pixels PX1, PX2, and PX3, the entire region of each of the contact members 190a, 190b, and 190c may otherwise overlap the region where the opening 355 of the fifth insulating layer 350 is not disposed.

Referring to FIGS. 2 and 4, the contact members 190a, 190b, and 190c may not overlap the active pattern 130a of the first transistor T1.

Additionally, the lower pattern 111a is electrically connected to the pixel electrodes 191a, 191b, and 191c through the capacitor electrode 175, and also overlaps the channel region 134a of the first transistor T1As a result, a current variation rate is reduced in a saturation region of a voltage-current characteristic graph of the first transistor T1 so that a range of a region where the output current of the first transistor T1 is constant may be increased. Therefore, even if there is a change in the source-drain voltage Vds of the first transistor T1, the output current of the first transistor T1 is kept constant, thereby improving a characteristic output saturation. Thus, a luminance deviation between the pixels due to the output current of the first transistor T1 is reduced, thereby improving resultant image quality.

Figure 8:
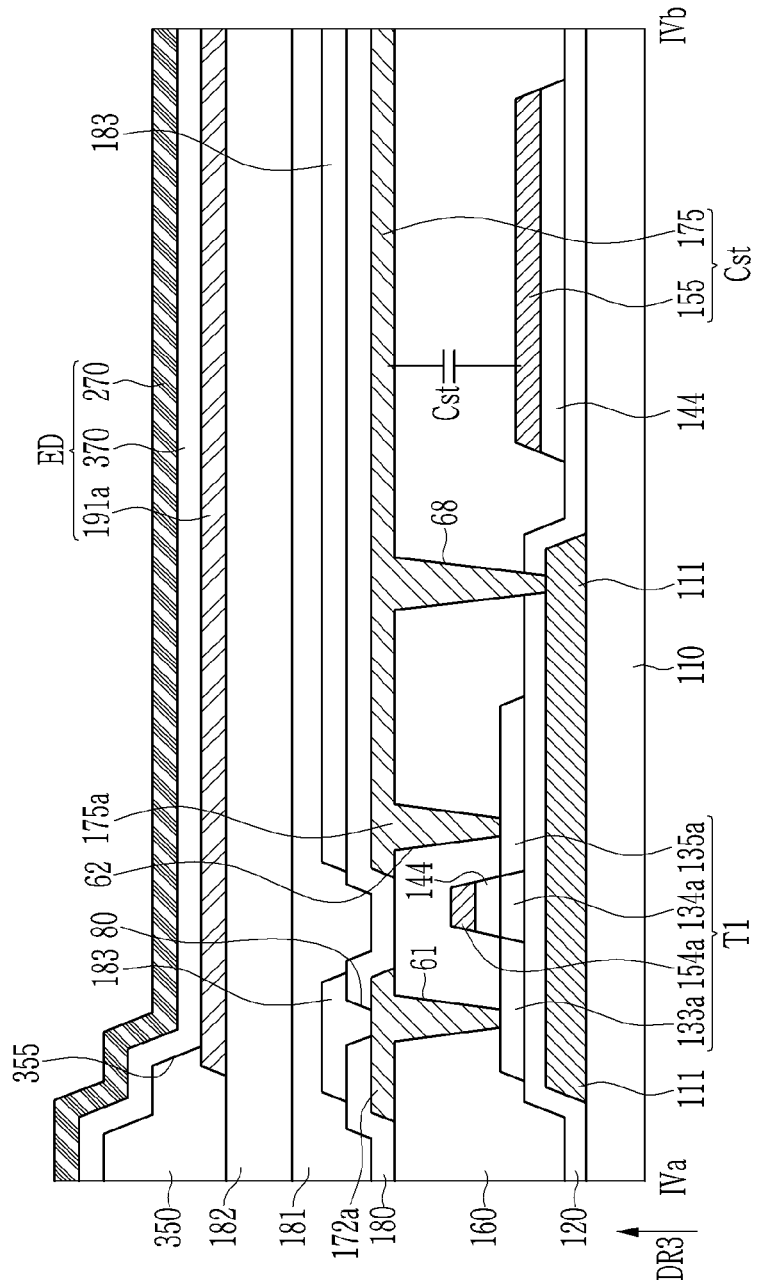
FIG. 8 is another cross-sectional view of the display device shown in FIG. 2 taken along line IVa-IVb of FIG. 2.

The display device according to an exemplary embodiment of the invention is described with reference to FIGS. 2 and 8. Referring to FIG. 8, the display device according to the exemplary embodiment differs from the embodiment discussed above in that a sixth insulating layer 180 is disposed between the third conductive layer and the third insulating layer 181, and a sixth conductive layer is disposed between the sixth insulating layer 180 and the third insulating layer 181.

In the plan view shown in FIG. 2, the sixth conductive layer may include a conductive pattern extending approximately parallel to the conductive pattern of the third conductive layer including the data lines 171a, 171b, and 171c, the driving voltage lines 172a, 172c, and 172d, the common voltage line 170, and the initialization voltage line 173, and is electrically connected thereto. For example, referring to FIG. 8, the sixth conductive layer may include conductive patterns 183. As shown in FIG. 2, the conductive pattern 183 may have a planar shape that is substantially similar to the conductive pattern of the third conductive layer.

The conductive pattern of the third conductive layer and the conductive pattern 183 of the sixth conductive layer may correspond to each other and overlap each other in a plan view, and the overlapping area may be more than about 90% of the area of each conductive pattern. However, the ratio of the overlapping area is not limited to such an exact quantity.

Each conductive pattern 183 may be electrically connected to the corresponding conductive pattern of the third conductive layer through an opening 80 of the sixth insulating layer 180. The conductive pattern 183 may reduce a resistance value by transmitting the same voltage as that of the conductive pattern of the connected third conductive layer.

According to another exemplary embodiment, some among the data lines 171a, 171b, and 171c, the driving voltage lines 172a, 172c, and 172d, the common voltage line 170, the initialization voltage line 173, the capacitor electrode 175, and the connecting members 174, 176, 177, and 178 may be disposed in the sixth conductive layer.

The display device according to an exemplary embodiment of the invention is described with reference to FIGS. 9-10.

Figure 9:
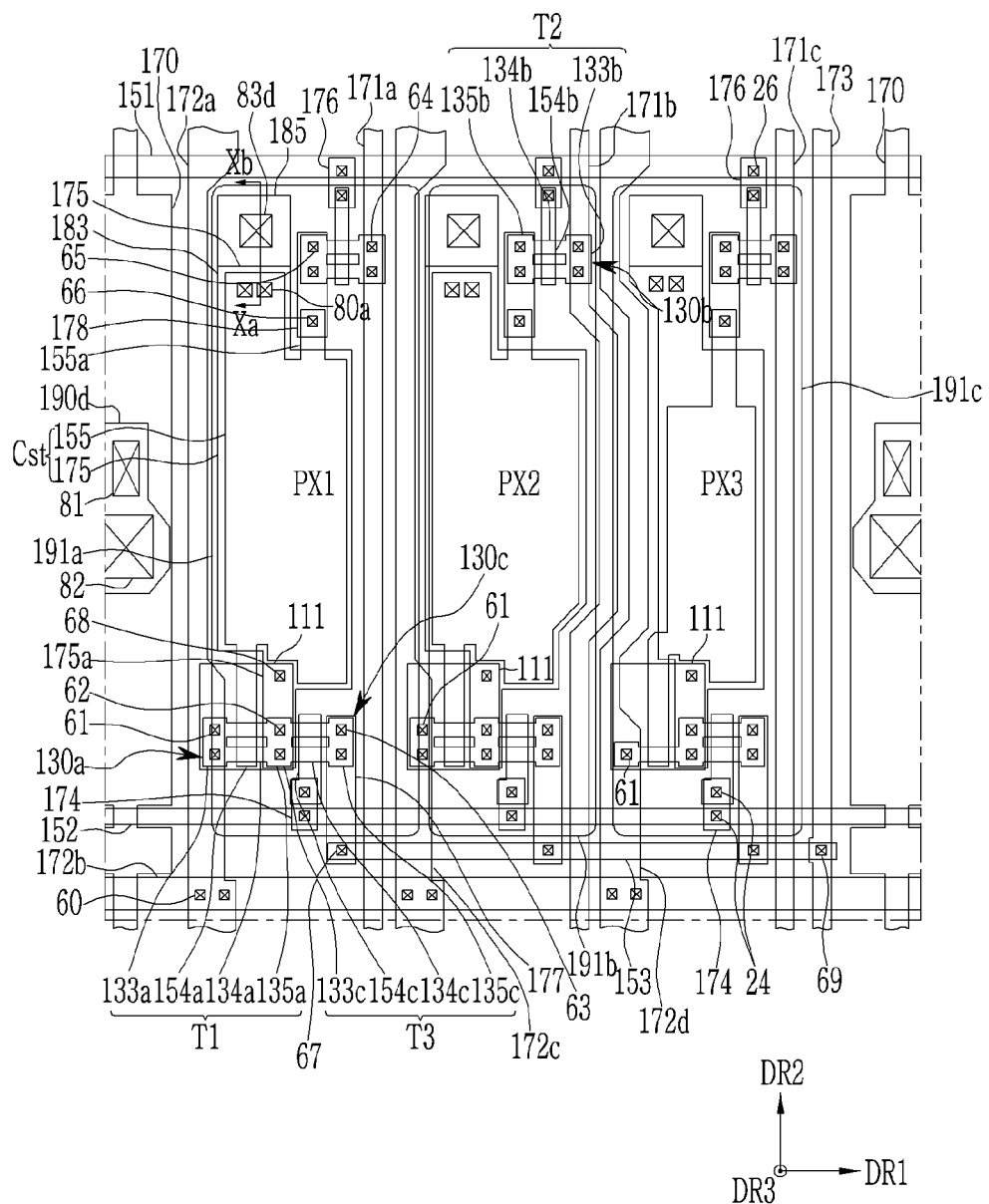
FIG. 9 is a plan layout view of pixels of a display device according to an exemplary embodiment of the invention.
Figure 10:
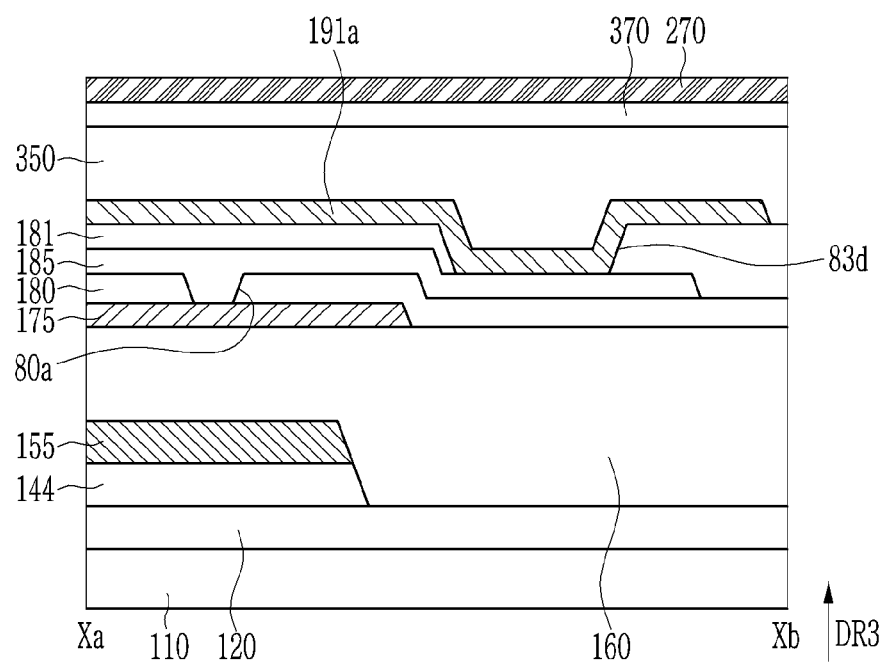
FIG. 10 is a cross-sectional view of the display device shown in FIG. 9 taken along line Xa-Xb of FIG. 9.

In this regard, FIG. 9 is a plan layout view of pixels of a display device according to an exemplary embodiment of the, and FIG. 10 is a cross-sectional view of the display device shown in FIG. 9 taken along line Xa-Xb.

Though similar to the exemplary embodiment shown in FIG. 8, the embodiment differs in that the configurations of the capacitor electrode 175 of the third conductive layer and the conductive pattern of the sixth conductive layer overlapping the capacitor electrode 175 may be changed.

For example, the conductive pattern 183 of the sixth conductive layer, which is electrically connected to the capacitor electrode 175, may include a protrusion 185, such as a contact member, that does not overlap the capacitor electrode 175. Further, most of the conductive patterns 183, except the protrusion 185 of each may overlap the capacitor electrode 175 when shown in the plan view of FIG. 9, wherein the overlapping area may be more than about 90% of the area of the conductive pattern 183, but is not limited to such an exact quantity.

As shown, the sixth insulating layer 180 includes an opening 80a disposed on the capacitor electrode 175, and the conductive pattern 183 of the sixth conductive layer overlapping the capacitor electrode 175 may be electrically connected to the capacitor electrode 175 through the opening 80a.

The third insulating layer 181 may include an opening 83d disposed above the protrusion 185 of the conductive pattern 183 of the sixth conductive layer.

In the plan view of FIG. 9 and the cross-sectional view of FIG. 10, the center of the opening 83d is not aligned with the center of the opening 80a of the sixth insulating layer 180, and are spaced apart. For instance, the opening 80a and the opening 83d, as shown in FIG. 9, may be spaced apart, not overlapped, or partially overlapped in the plan view.

As shown, the opening 80a and the opening 83d both overlap the conductive pattern 183 of the corresponding sixth conductive layer of each of the pixels PX1, PX2, and PX3. The opening 83d may overlap the capacitor electrode 175 in a plan view or may not overlap. That is, the opening 83d need not overlap the capacitor electrode 175, and the position of the opening 83d may be formed independently of the position of the capacitor electrode 175. The shape of the protrusion 185 of the conductive pattern 183 of the sixth conductive layer may be changed according to the position of the opening 83d.

The edge of the opening 355 of the fifth insulating layer 350 defining the light emission region of each of the pixels PX1, PX2, and PX3 may be spaced apart from the opening 83d without overlapping the opening 83d. Accordingly, the emission layer 370 may be prevented from being disconnected due to a step near the light emission region edge, thereby preventing a reduction of a light emitting period of the light emitting diode (LED) ED. That is, the emission layer 370 may continue to operate to emit light since it is not overlapped at the edge of the opening 355, such that the edge of the opening 355 is disposed away from the protrusion 185 and a contact member 190a, 190b, or 190c. Accordingly, a design of an overall pixel structure may be advantageously adapted based on a corresponding number of conductive layers, insulating layers, and provided openings without being restricted to aligning such openings to deliver an electrical connection within a pixel and light emission according to the pixel.

The display device according to the exemplary embodiment shown in FIG. 8 to FIG. 10 may or may not include the fourth conductive layer and the fourth insulating layer 182 included in the display device according to the exemplary embodiment shown in FIG. 2 to FIG. 7. FIG. 8 shows the exemplary embodiment including the fourth conductive layer and the fourth insulating layer 182, while FIG. 10 shows the exemplary embodiment without the fourth conductive layer and the fourth insulating layer 182.

The display device according to an exemplary embodiment of the invention is described with reference to FIG. 11.

Figure 11:
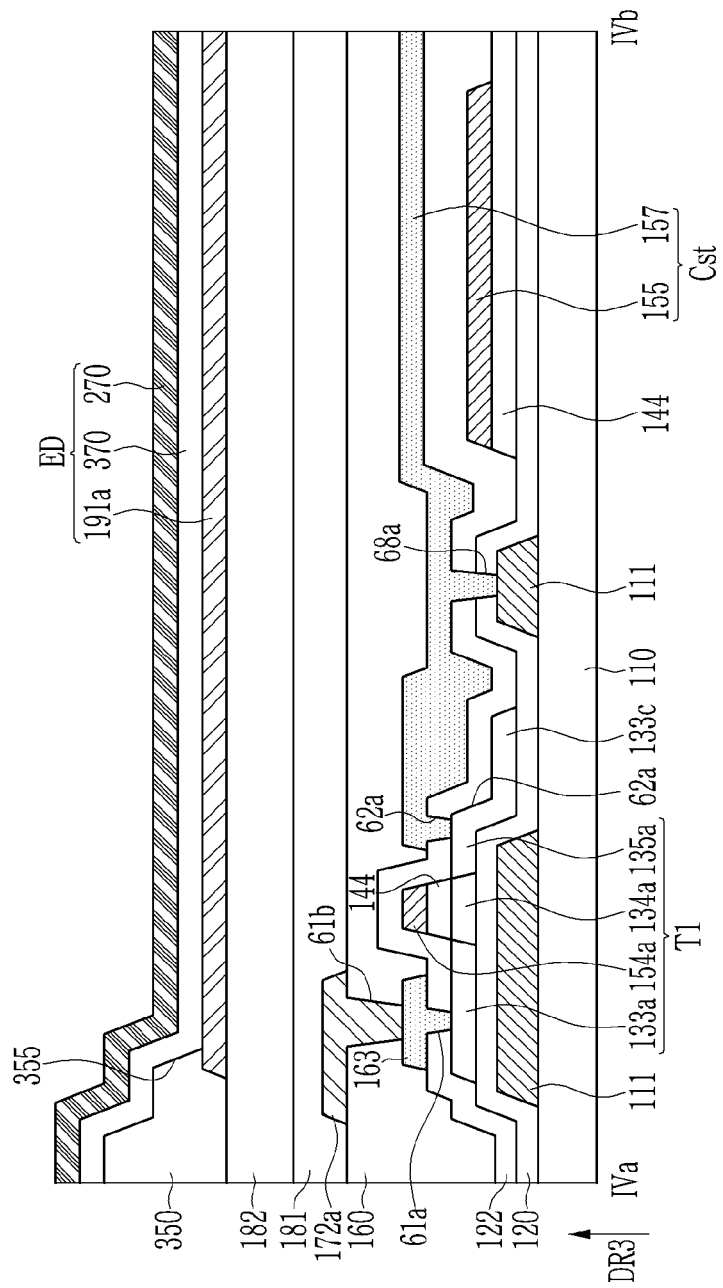
FIG. 11 is another cross-sectional view of the display device shown in FIG. 2 taken along line IVa-IVb of FIG. 2.

In this regard, FIG. 11 represents another cross-sectional view of the display device shown in FIG. 9 taken along line IVa-IVb of FIG. 2.

Referring to FIG. 11, the display device according to the exemplary embodiment may be similar to the above-described exemplary embodiment of FIGS. 2-7, however a seventh insulating layer 122 is disposed on the second conductive layer, and a seventh conductive layer is disposed between the seventh insulating layer 122 and the second insulating layer 160.

The seventh insulating layer 122 may be in contact with the top surface of the conductive regions of the active patterns 130a, 130b, and 130c. The seventh insulating layer 122 may include an opening 61a disposed on the source region 133a of the active pattern 130a, and an opening 62a disposed on the drain region 135a of the active pattern 130a. The seventh insulating layer 122 and the buffer layer 120 may include an opening 68a disposed on the lower pattern 111.

An embodiment may include a capacitor electrode 157 disposed in the seventh conductive layer instead of the capacitor electrode 175 described above. The capacitor electrode 157 may be electrically connected to the lower pattern 111 through the opening 68a, and may be electrically connected to the drain region 135a of the active pattern 130a through the opening 62a.

The capacitor electrode 157 may have a planar shape similar to the capacitor electrode 175 described above. The capacitor electrode 157 overlaps the corresponding driving gate electrode 155 via the seventh insulating layer 122 therebetween to form the capacitor Cst.

The seventh conductive layer may further include a connection pattern 163. For example, the seventh conductive layer may include the connection pattern 163 being in contact with the source region 133a of the active pattern 130a through the opening 61a, and the driving voltage line 172a being in contact with the connection pattern 163 through an opening 61b of the second insulating layer 160 so as to be electrically connected, such that the driving voltage line 172a may be electrically connected to the source region 133a of the active pattern 130a.

The display device according to an exemplary embodiment of the invention is described with reference to FIGS. 12-13.

Figure 12:
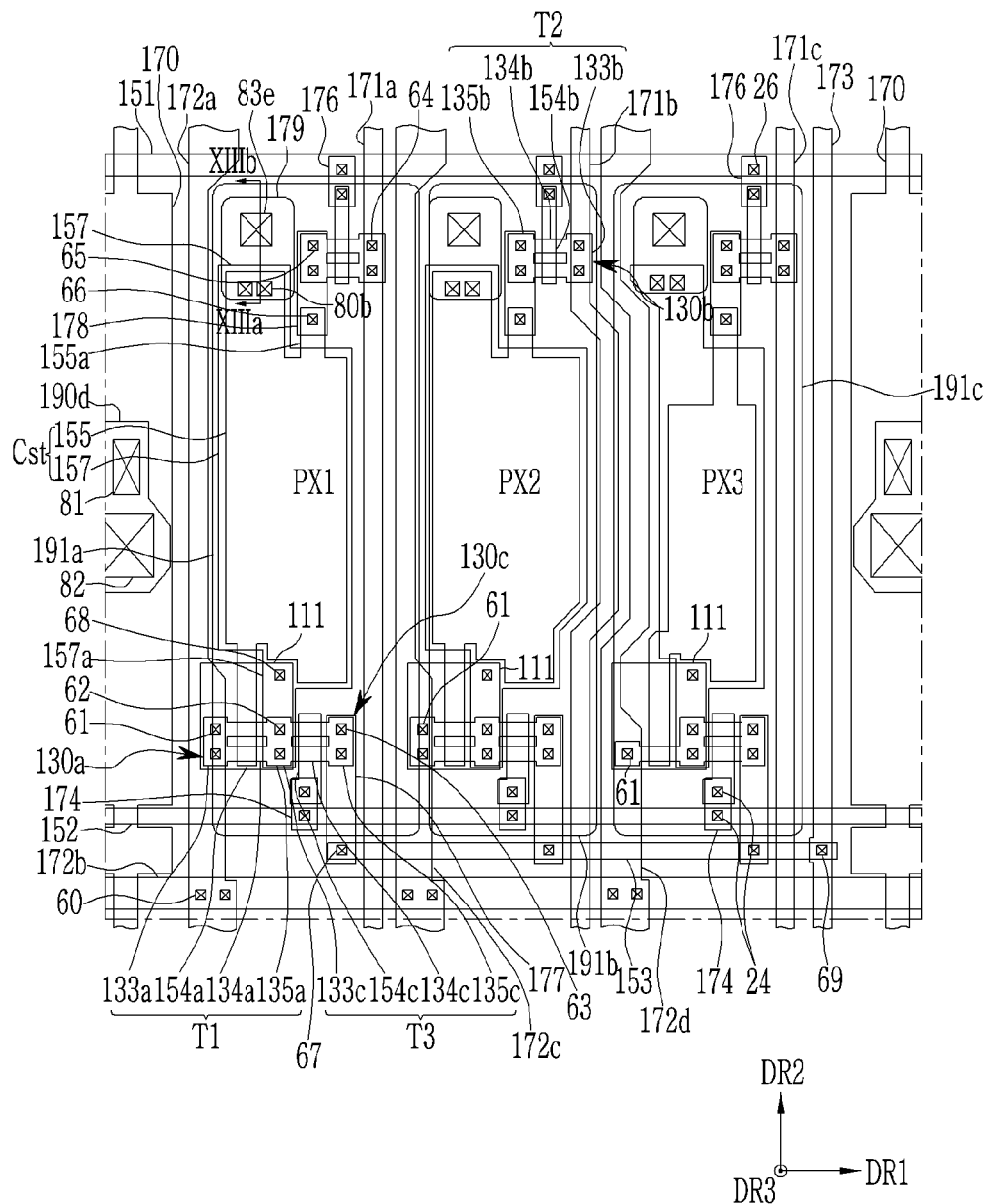
FIG. 12 is a plan layout view of pixels of a display device according to an exemplary embodiment of the invention.
Figure 13:
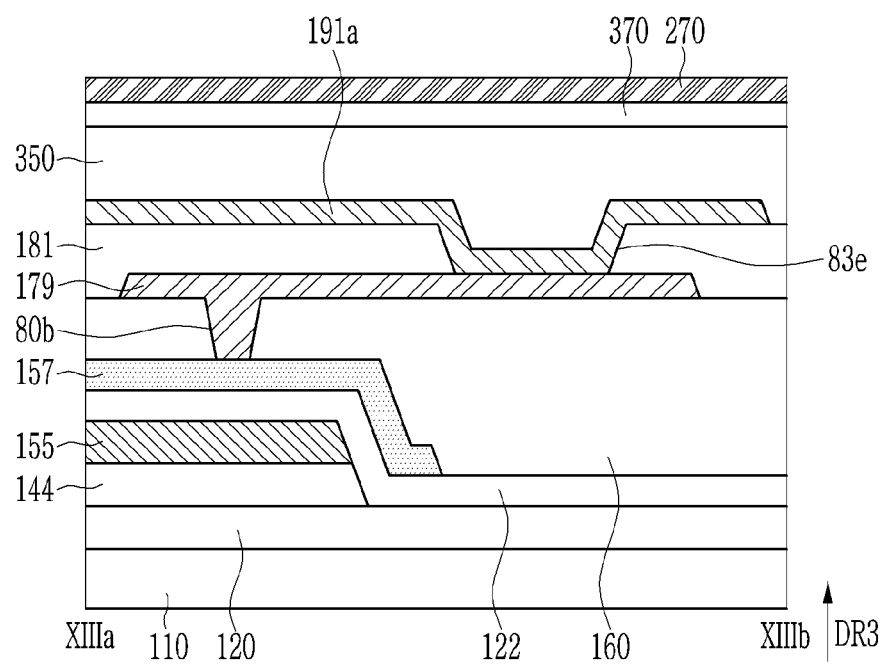
FIG. 13 is a cross-sectional view of the display device shown in FIG. 12 taken along line XIIIa-XIIIb of FIG. 12.

In this regard, FIG. 12 is a plan layout view of pixels of a display device according to an exemplary embodiment of the invention, and FIG. 13 is a cross-sectional view of the display device taken along line XIIIa-XIIIb of FIG. 12.

Though similar to the display device according to the exemplary embodiment shown in FIG. 11, the configuration of the capacitor electrode 157 of the seventh conductive layer and the third conductive layer may be changed.

For example, the third conductive layer may include a contact member 179 of a conductive pattern electrically connected to the capacitor electrode 157, and including a part that does not overlap the capacitor electrode 157.

The second insulating layer 160 may include an opening 80b disposed on the capacitor electrode 157, and the contact member 179 of the third conductive layer may be electrically connected to the capacitor electrode 157 through the opening 80b.

The third insulating layer 181 may include an opening 83e disposed on the contact member 179 of the third conductive layer.

In both a plan view and a cross-sectional view, the center of the opening 83e is not aligned with the center of the opening 80b of the second insulating layer 160, and they are spaced apart from each other. As shown in the plan view of FIG. 12, the opening 80b and the opening 83e may be spaced apart from each other and not overlap each other, or they may partially overlap each other.

Referring to FIGS. 12 and 13, the opening 80b and the opening 83e both overlap the contact member 179 of the corresponding third conductive layer of each of the pixels PX1, PX2, and PX3. The opening 83e may overlap the capacitor electrode 157 in a plan view or may not overlap the capacitor electrode 157. That is, the opening 83e need not overlap the capacitor electrode 157, and the position of the opening 83e may be formed independently from the position of the capacitor electrode 157. The shape of the contact member 179 of the third conductive layer may be changed depending on the position of the opening 83e.

The edge of the opening 355 of the fifth insulating layer 350 defining the light emission region of each of the pixels PX1, PX2, and PX3 may be spaced apart from the opening 83e without overlapping the opening 83e. Accordingly, the emission layer 370 may be prevented from being disconnected due to a step near the light emission region edge, thereby preventing a reduction of a light emitting period of the light emitting diode (LED) ED. That is, the emission layer 370 may continue to operate to emit light since it is not overlapped at the edge of the opening 355, such that the edge of the opening 355 is disposed away from the contact member 179. Accordingly, a design of an overall pixel structure may be advantageously adapted based on a corresponding number of conductive layers, insulating layers, and provided openings without being restricted to aligning such openings to deliver an electrical connection within a pixel and light emission according to the pixel.

The display device according to the exemplary embodiment shown in FIG. 11 to FIG. 13 may or may not include the fourth conductive layer and the fourth insulating layer 182 included in the display device according to the exemplary embodiment shown in FIG. 2 to FIG. 7 described above. FIG. 11 shows the exemplary embodiment including the fourth conductive layer and the fourth insulating layer 182, while FIG. 13 shows the exemplary embodiment without the fourth conductive layer and the fourth insulating layer 182.

The display device according to an exemplary embodiment of the invention is described with reference to FIG. 14 to FIG. 16.

Figure 14:
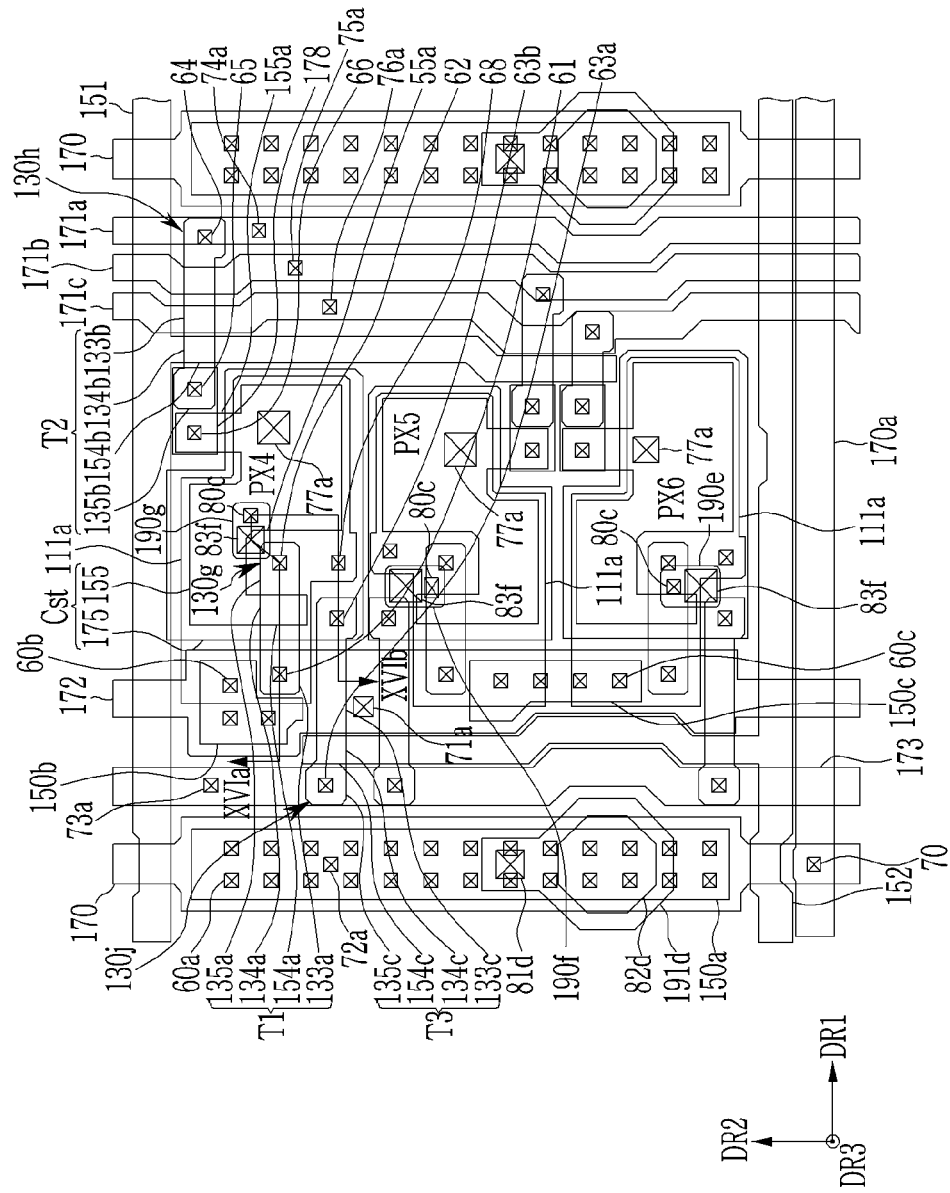
FIG. 14 is a plan layout view of pixels of a display device according to an exemplary embodiment of the invention.
Figure 15:
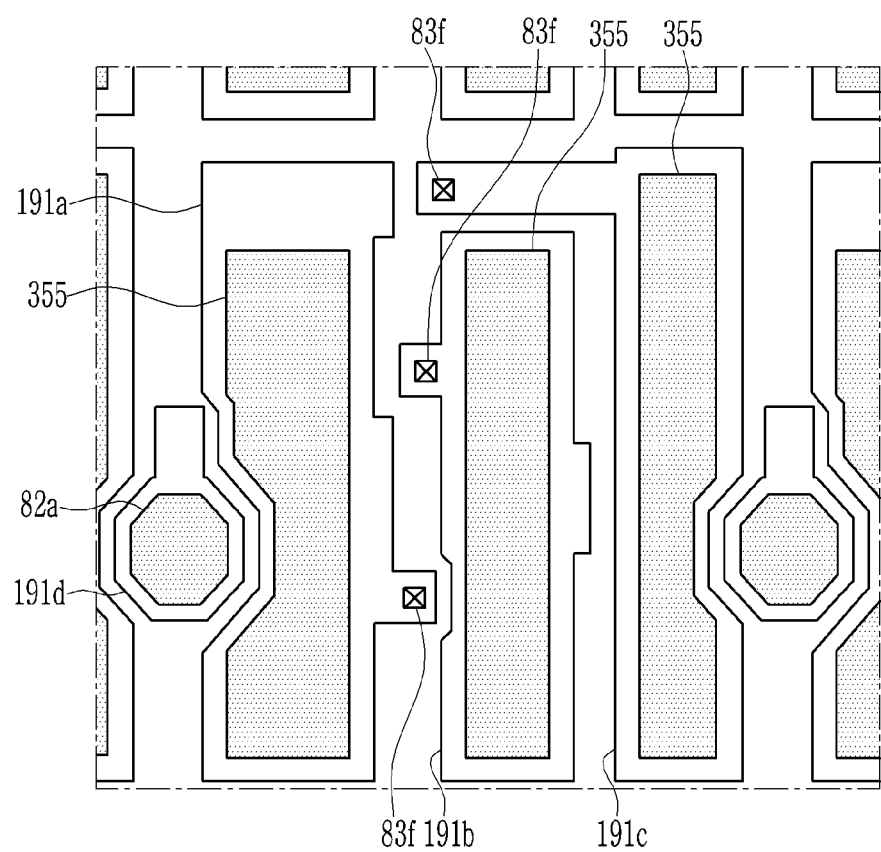
FIG. 15 is a plan layout view of a pixel electrode layer of a display device according to an exemplary embodiment of the invention.
Figure 16:
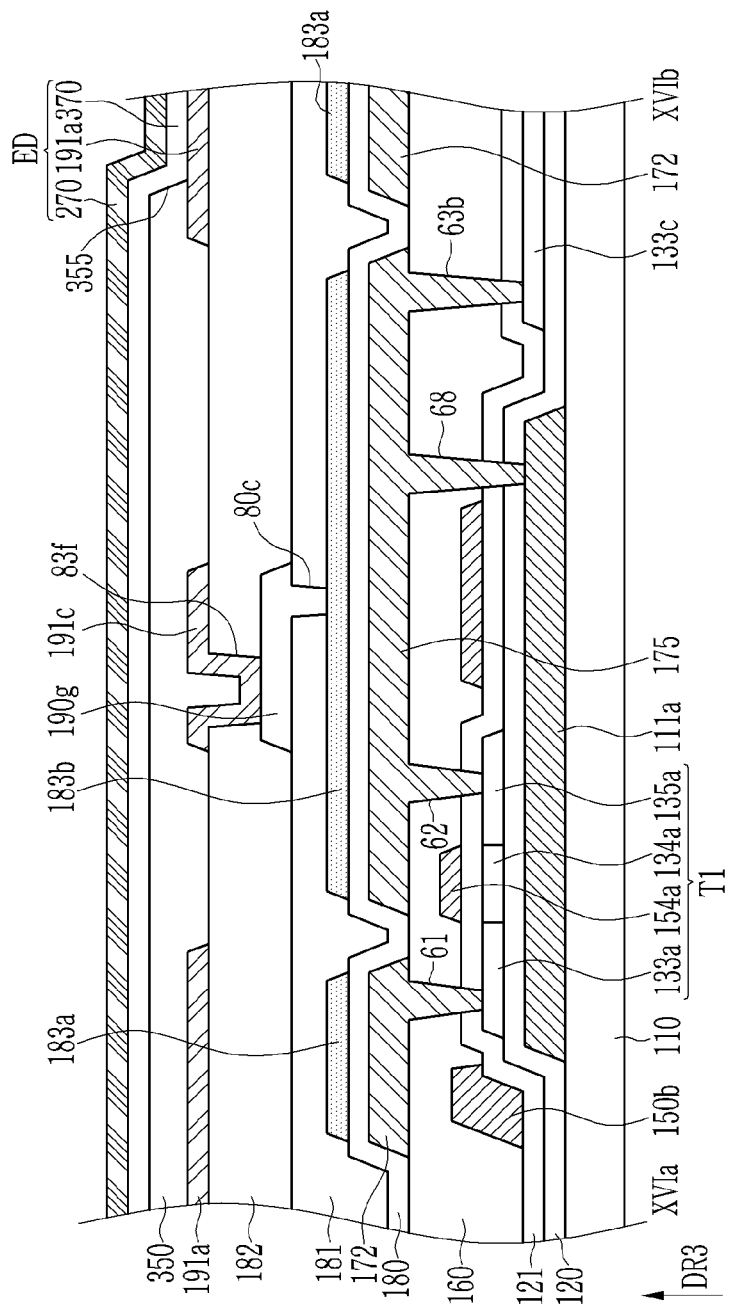
FIG. 16 is a cross-sectional view of the display device shown in FIG. 14 taken along line XVIa-XVIb.

FIG. 14 is a plan layout view of pixels of a display device according to an exemplary embodiment of the invention, FIG. 15 is a plan layout view of a pixel electrode layer of a display device according to an exemplary embodiment of the invention, and FIG. 16 is a cross-sectional view of the display device taken along line XVIa-XVIb of FIG. 14.

Though the display device according to the exemplary embodiment is similar to the display device according to the above-described exemplary embodiments with respect to the described connections and the shown structure of the constituent elements, the shape of each of the elements and manner of their connection may be changed.

Referring to FIG. 14, pixels PX4, PX5, and PX6 of one repeated group of pixels may be substantially arranged in the second direction DR2, while when referring to FIG. 15, the pixel electrodes 191a, 191b, and 191c respectively corresponding to the pixels PX4, PX5, and PX6 may be substantially arranged in the first direction DR1. However, various other configurations for the structure of the pixels PX4, PX5, and PX6 and the pixel electrodes 191a, 191b, and 191c are possible and within the spirit and scope of the invention.

Referring to FIG. 14, the data lines 171a, 171b, and 171c, the driving voltage line 172, and the initialization voltage line 173 may be disposed between two adjacent common voltage lines 170.

A first scan line 151 and a second scan line 152 may be respectively disposed below and above the pixels PX4, PX5, and PX6 of one group of pixels.

The above-described first conductive layer may include lower patterns 111a, and each lower pattern 111a may be disposed in each of the pixels PX4, PX5, and PX6. The first conductive layer may further include a transverse common voltage line 170a approximately extending in the first direction DR1.

Active patterns 130g, 130h, and 130j may be disposed in the active layer and may include the channel regions 134a, 134b, and 134c, the source regions 133a, 133b, and 133c, and the drain regions 135a, 135b, and 135c. In each of the pixels PX4, PX5, and PX6, the active patterns 130g, 130h, and 130j may be separated from each other.

The second conductive layer may include the first scan line 151, the second scan line 152, the driving gate electrode 155, the second gate electrode 154b, and the third gate electrode 154c. The first and second scan lines 151 and 152, respectively, may be extended in the first direction DR1. Each driving gate electrode 155 may be disposed corresponding to each of the pixels PX4, PX5, and PX6.

Second gate electrodes 154b corresponding to the pixels PX4, PX5, and PX6 are connected to each other, and extend entirely in the second direction DR2 toward the second scan line 152.

Third gate electrodes 154c corresponding to the pixels PX4, PX5, and PX6 are connected to each other, and extend entirely in the second direction DR2 toward the first scan line 151.

The driving gate electrode 155 disposed in each of the pixels PX4, PX5, and PX6 may include the first gate electrode 154a protruding upward or downward. The first gate electrode 154a intersects the active pattern 130g and overlaps the channel region 134a of the active pattern 130g. The second gate electrode 154b intersects the active pattern 130h, and overlaps the channel region 134b of the active pattern 130h. The third gate electrode 154c intersects the active pattern 130j, and overlaps the channel region 134c of the active pattern 130j.

The third conductive layer may include the data lines 171a, 171b, and 171c, the driving voltage line 172, the common voltage line 170, the initialization voltage line 173, the capacitor electrode 175, and the connecting members 178.

The data lines 171a, 171b, and 171c, the driving voltage line 172, the common voltage line 170, and the initialization voltage line 173 may respectively extend in the approximate second direction DR2, thereby crossing the first and second scan lines 151 and 152.

Each of the data lines 171a, 171b, and 171c is electrically connected to the source region 133b of the active pattern 130h through the opening 64. The driving voltage line 172 is electrically connected to the source region 133a of the active pattern 130g through the opening 61. The initialization voltage line 173 is electrically connected to the drain region 135c of the active pattern 130j via the opening 63a. The openings 61, 63a, and 64 may be formed in the second insulating layer 160.

The capacitor electrode 175 may be disposed in each of the pixels PX4, PX5, and PX6, and may be disposed between the driving voltage line 172 and the data line 171c in a plan view. The capacitor electrode 175 may overlap the corresponding driving gate electrode 155 via the second insulating layer 160 therebetween to form the capacitor Cst.

The capacitor electrode 175 is electrically connected to the drain region 135a of the active pattern 130g through the opening 62 of the second insulating layer 160, and is electrically connected to the source region 133c of the active pattern 130j through an opening 63b of the second insulating layer 160 and a first insulating layer 121. In addition, the capacitor electrode 175 is electrically connected to the lower pattern 111a through the opening 68 of the second insulating layer 160, the first insulating layer 121, and the buffer layer 120. The driving gate electrode 155 includes an opening 55a overlapping the opening 62 for the contact between the capacitor electrode 175 and the drain region 135a of the active pattern 130g. As such, the driving gate electrode 155 encloses the periphery of the opening 62.

In each of the pixels PX4, PX5, and PX6, the connecting member 178 is electrically connected to the drain region 135b of the active pattern 130h through the opening 65, and is electrically connected to the protrusion 155a of the driving gate electrode 155 through the opening 66, thereby the drain region 135b of the active pattern 130h and the protrusion 155a of the driving gate electrode 155 may be electrically connected to each other.

The display device according to the present exemplary embodiment, like the exemplary embodiment shown in FIG. 8 to FIG. 10 described above, may include the sixth insulating layer 180 and the sixth conductive layer disposed between the third conductive layer and the third insulating layer 181.

The sixth conductive layer may include the conductive patterns having a similar shape to the conductive pattern of the third conductive layer such as the data lines 171a, 171b, and 171c, the driving voltage line 172, the common voltage line 170, the initialization voltage line 173, and the capacitor electrode 175 disposed in the underlying third conductive layer, and may be electrically connected to the corresponding conductive pattern of the third conductive layer.

For example, each of the data lines 171a, 171b, and 171c may be electrically connected to the corresponding conductive pattern disposed in the sixth conductive layer through each of openings 74a, 75a, and 76a, the driving voltage line 172 may be electrically connected to a corresponding conductive pattern 183a disposed in the sixth conductive layer through an opening 71a, the common voltage line 170 may be electrically connected to the corresponding conductive pattern disposed in the sixth conductive layer through an opening 72a, the initialization voltage line 173 may be electrically connected to the corresponding conductive pattern disposed in the sixth conductive layer through an opening 73a, and the capacitor electrode 175 may be electrically connected to a corresponding conductive pattern 183b disposed in the sixth conductive layer through an opening 77a.

The conductive patterns of the sixth conductive layer transmit the same voltage as the connected third conductive layer, thereby reducing a resistance value.

The third insulating layer 181 may include an opening 80c located on the conductive pattern 183b.

The display device according to the present exemplary embodiment may include the fourth conductive layer and the fourth insulating layer 182 as described above.

The fourth conductive layer may include the contact members 190g, 190f, and 190e having an island shape, and disposed in each of the pixels PX4, PX5, and PX6. Each of the contact members 190g, 190f, and 190e may be in contact with the corresponding conductive pattern 183b through the opening 80c to be electrically connected. Accordingly, each of the contact members 190g, 190f, and 190e may be electrically connected to the capacitor electrode 175 which is electrically connected to the conductive pattern 183b. Each of the contact members 190g, 190f, and 190e may overlap the capacitor electrode 175, the conductive pattern 183b, and the opening 80c in each of the pixels PX4, PX5, and PX6, when shown in plan view.

As shown in FIG. 14, in each of the pixels PX4, PX5, and PX6, the contact members 190g, 190f, and 190e may or may not overlap the capacitor electrode 175 and the conductive pattern 183b.

The fourth insulating layer 182 may include openings 83f disposed on each of the contact members 190g, 190f, and 190e.

As shown in FIGS. 14-16, the center of the opening 83f is not aligned with the center of the opening 80c, and they are spaced apart from each other. As shown in FIG. 14, the opening 83f and the opening 80c may be spaced apart from each other and may not overlap with each other, or may partially overlap with each other.

The opening 83f and the opening 80c both overlap the corresponding contact members 190g, 190f, and 190e of each of the pixels PX4, PX5, and PX6. The opening 83f may or may not overlap the capacitor electrode 175 and the conductive pattern 183b when shown in plan view. That is, the opening 83f need not overlap the capacitor electrode 175 and the conductive pattern 183b, and the position of the opening 83f can be formed independently from the position of the capacitor electrode 175 and the conductive pattern 183b. The shape of the contact members 190g, 190f, and 190e may be changed depending on the position of the opening 83f.

Referring to FIG. 14 to FIG. 16, the edge of the opening 355 of the fifth insulating layer 350 defining the light emission region of each of the pixels PX4, PX5, and PX6 does not overlap the opening 83f, and may be spaced from the opening 83f. Accordingly, the emission layer 370 may be prevented from being disconnected due to a step near the light emission region edge, thereby preventing a reduction of a light emitting period of the light emitting diode (LED) ED. That is, the emission layer 370 may continue to operate to emit light since it is not overlapped at the edge of the opening 355, such that the edge of the opening 355 is disposed away from a contact member 190g, 190f, or 190e. Accordingly, a design of an overall pixel structure may be advantageously adapted based on a corresponding number of conductive layers, insulating layers, and provided openings without being restricted to aligning such openings to deliver an electrical connection within a pixel and light emission according to the pixel.

The third insulating layer 181 may further include an opening 81d disposed on the conductive pattern of the sixth conductive layer connected to the common voltage line 170.

Referring to FIG. 14 and FIG. 15, the pixel electrodes 191a, 191b, and 191c disposed in the pixel electrode layer of the fifth conductive layer and corresponding to each of the pixels PX4, PX5, and PX6 may be electrically connected to the contact members 190g, 190f, and 190e that are electrically connected to the capacitor electrode 175 through the opening 83f included in the fourth insulating layer 182. Each of the pixel electrodes 191a, 191b, and 191c is electrically connected to the drain region 135a of the first transistor T1 via the capacitor electrode 175, thereby receiving voltage from the first transistor T1.

The pixel electrode layer 191a may further include the contact member 191d connected to the common voltage line 170 or the above-described contact member 190d. The common electrode 270 is electrically connected to the contact member 191d through an opening 82d included in the fifth insulating layer 350 and the emission layer 370, thereby receiving the common voltage from the common voltage line 170.

The common voltage line 170 may be electrically connected to the transverse common voltage line 170a through an opening 70.

The second conductive layer may include a conductive pattern 150a overlapping the common voltage line 170 and conductive patterns 150b and 150c overlapping the driving voltage line 172. In this case, the conductive pattern 150a is electrically connected to the common voltage line 170 through openings 60a of the second insulating layer 160, thereby reducing a resistance value. The conductive patterns 150b and 150c are electrically connected to the driving voltage line 172 through openings 60b and 60c of the second insulating layer 160. However, the conductive patterns 150a, 150b, and 150c may be omitted.

Herein, the constituent elements disposed in a same conductive layer may each include a same material, and the constituent elements disposed in a same insulating layer may each include a same material.

While the invention has been illustrated and described with reference to the embodiments thereof, it will be apparent to those of ordinary skill in the art that various changes in form and detail may be formed thereto without departing from the spirit and scope of the invention.

What is claimed is:
1. A display device, comprising:
a substrate;
a first transistor disposed on the substrate, and including a first active pattern having a first channel region, a first source region, a first drain region, and a first gate electrode;
a first insulating layer disposed on the first transistor;
a first electrode disposed on the first insulating layer, and electrically connected to the first drain region, the first electrode being a continuous layer;

a second insulating layer having a first opening disposed on the first electrode;
a first contact member disposed on the second insulating layer, and electrically connected to the first electrode through the first opening;
a third insulating layer having a second opening disposed on the first contact member;
a pixel electrode disposed on the third insulating layer, and electrically connected to the first contact member through the second opening; and
an emission layer disposed on the pixel electrode, wherein
the first gate electrode overlaps the first electrode to form a capacitor,
when shown in a plan view, a center of the second opening is spaced from a center of the first opening, and
when shown in cross-section, a light emitting region of the pixel electrode is disposed away from the first contact member.

2. The display device of claim 1, wherein:
when shown in the plan view, the first contact member does not overlap the first gate electrode.

3. The display device of claim 1, wherein:
when shown in the plan view, a portion of the second opening overlaps the first opening.

4. The display device of claim 1, further comprising:
a conductive layer disposed on the substrate, and when shown in cross-section, the conductive layer overlaps the first channel region.

5. The display device of claim 1, wherein:
when shown in the plan view, the first contact member does not overlap the first active pattern.

6. The display device of claim 1, further comprising:
a fourth insulating layer having a third opening disposed on the pixel electrode; and
a common electrode disposed on the emission layer, wherein,
when shown in the plan view, the second opening does not overlap the third opening, and
when shown in cross-section, a portion of the emission layer is disposed in the third opening, and an edge of the third opening is a light defining region of the pixel electrode.

7. The display device of claim 6, wherein:
the first contact member does not overlap the third opening.

8. The display device of claim 6, further comprising:
a common voltage line to transmit a common voltage, and disposed between the first insulating layer and the second insulating layer; and
a second contact member disposed between the second insulating layer and the third insulating layer, and disposed in a same layer and including a same material as the first contact member, wherein
the second insulating layer further includes a fourth opening disposed on the common voltage line,
the third insulating layer further includes a fifth opening disposed on the second contact member,
the common electrode is electrically connected to the second contact member through the fifth opening, and
the second contact member is electrically connected to the common voltage line through the fourth opening.

9. The display device of claim 1, wherein:
when shown in cross-section, at least a portion of the first contact member does not overlap the first electrode.

10. The display device of claim 1, further comprising:
a second transistor disposed on the substrate and including a second active pattern having a second channel region, a second source region, a second drain region, and a second gate electrode, the second drain region being electrically connected to the first gate electrode.

11. The display device of claim 1, wherein:
when shown in the plan view, the second opening includes a portion that does not overlap the first electrode.

12. The display device of claim 1, wherein:
when shown in the plan view, the first insulating layer includes a first insulating layer opening, and the first electrode is electrically connected to the first drain region through the first insulating layer opening.

13. The display device of claim 1, wherein:
the first contact member comprises ITO or IZO.

14. A display device, comprising:
a first transistor including a first gate electrode;
a driving gate electrode including the first gate electrode;
a capacitor electrode overlapping the driving gate electrode to form a capacitor, the capacitor electrode being a continuous layer;
a first insulating layer having a first opening overlapping a portion of the capacitor electrode;
a contact member electrically connected to the capacitor electrode through the first opening, the contact member being a continuous layer;
a second insulating layer having a second opening overlapping the contact member;
a pixel electrode electrically connected to the contact member through the second opening;
an emission layer disposed on the pixel electrode; and
a common electrode disposed on the emission layer, wherein
when shown in a plan view, a center of the second opening and a center of the first opening are spaced from each other, and
when shown in cross-section, a light emitting region of the pixel electrode is disposed away from the contact member.

15. The display device of claim 14, wherein:
when shown in the plan view, the contact member does not overlap the driving gate electrode.

16. The display device of claim 14, wherein:
when shown in the plan view, a portion of the second opening overlaps the first opening.

17. The display device of claim 14, further comprising:
a substrate, wherein
the first transistor being disposed on the substrate; and
a conductive layer is disposed on the substrate, and the conductive layer overlaps a channel region of the first transistor in a plan view.

18. The display device of claim 14, wherein:
the first transistor comprises an active pattern, and
when shown in the plan view, the contact member does not overlap the active pattern.

19. The display device of claim 14, further comprising:
a third insulating layer having a third opening disposed on the pixel electrode, wherein
the emission layer is disposed between the pixel electrode and the common electrode, and comprises a portion thereof disposed in the third opening,
when shown in the plan view, the second opening does not overlap the third opening, and
when shown in cross-section, a portion of the emission layer is disposed in the third opening, and an edge of the third opening is a light defining region of the pixel electrode.

20. The display device of claim 19, wherein:
the contact member does not overlap the third opening.

21. The display device of claim 14, wherein:
when shown in cross-section, at least a portion of the contact member does not overlap the capacitor electrode.

22. The display device of claim 14, further comprising:
a second transistor electrically connected to the driving gate electrode.

23. The display device of claim 14, wherein:
when shown in the plan view, the second opening includes a portion that does not overlap the capacitor electrode.

24. The display device of claim 14, wherein:
the contact member comprises ITO or IZO.

* * * * *